United States Patent [19]

Beetz, Jr. et al.

[11] Patent Number: 5,051,785
[45] Date of Patent: Sep. 24, 1991

[54] N-TYPE SEMICONDUCTING DIAMOND, AND METHOD OF MAKING THE SAME

[75] Inventors: Charles P. Beetz, Jr., New Milford; Douglas C. Gordon, Cornwall; Duncan W. Brown, Wilton, all of Conn.

[73] Assignee: Advanced Technology Materials, Inc., Danbury, Conn.

[21] Appl. No.: 369,763

[22] Filed: Jun. 22, 1989

[51] Int. Cl.$^5$ .............. H01L 29/280; H01L 29/720; H01L 49/020; H01L 21/205

[52] U.S. Cl. ............................ 357/4; 357/7; 357/8; 357/34; 156/DIG. 68; 423/446; 437/1; 437/81

[58] Field of Search ............ 357/4, 7, 8, 9, 30, 357/33, 34; 423/446; 437/1.81; 156/DIG. 68

[56] References Cited

U.S. PATENT DOCUMENTS

| | | | |
|---|---|---|---|
| 4,277,293 | 7/1981 | Nelson et al. | 148/175 |
| 4,571,447 | 2/1986 | Prins | 136/252 |
| 4,764,804 | 8/1988 | Sahara et al. | 357/81 |
| 4,816,291 | 3/1989 | Desphandey et al. | 427/38 |
| 4,863,529 | 9/1989 | Imai et al. | 148/33.4 |
| 4,939,043 | 7/1990 | Biricik et al. | 428/639 |

FOREIGN PATENT DOCUMENTS

| | | | |
|---|---|---|---|
| 0213126 | 12/1984 | Japan | 357/7 |
| 0171993 | 7/1987 | Japan | 357/7 |

OTHER PUBLICATIONS

Emerging Technology of Diamond Thin Films P. K. Bachman et al., Chem. and Eng. News, 5/15/89 pp. 24–39.
Char. of Conductive Diamond Film, Fujimori et al., Proc. ISIAT, 1985.
"Semiconducting Diamonds," V. S. Vavilov, et al, Sov. Phys. USP., vol. 19, No. 4, Apr. 1976, pp. 301, 316.
"Synthetic Diamonds in Electronics (Review)" V. K. Bashenov, et al, Sov. Phys. Semicond, vol. 19, No. 8, Aug. 1985, pp. 829–839.
"Bipolar Transistor Action in Ion Implanted Diamond," Brins, J. F., Appl. Phys. Lett., vol. 41, No. 10, Nov. 15, 1989, pp. 950–952.
"Electrical Properties of Ti and Cr Ion Implanted Diamonds Dependent on Target Temperature," S. Sato et al, Nuclear Instruments and Methods in Physics, pp. 822–825, (1987).
"Characterization of Conducting Diamond Films," N. Fujimori, et al, Vacuum, vol. 36, Nos. 1-3, pp. 99–102, 1986, Pergamon Press Limited.
"Semiconducting Diamond Technology," M. N. Yoder, Naval Research Review, vol. 2, pp. 27–31.
"Implantation of Antimony Ions into Diamond," V. S. Vavilov, et al, Soviet Physics–Semiconductors, vol. 6, No. 12, Jun. 1973, pp. 1998–2002.

(List continued on next page.)

Primary Examiner—Rolf Hille
Assistant Examiner—Peter T. Brown
Attorney, Agent, or Firm—Steven J. Hultquist

[57] ABSTRACT

N-type semiconducting diamond is disclosed, which is intrinsically, i.e., at the time of diamond formation, doped with n-type dopant atoms. Such diamond is advantageously formed by chemical vapor deposition from a source gas mixture comprising a carbon source compound for the diamond, and a volatile precursor compound for the n-type impurity species, so that the n-type impurity atoms are doped in the diamond film in situ during its formation. By such in situ formation technique, shallow n-type impurity atoms, e.g., lithium, arsenic, phosphorous, scandium, antimony, bismuth, and the like, may be incorporated into the crystal lattice in a uniform manner, and without the occurrence of gross lattice asperities and other lattice damage artifacts which result from ion implanation techniques. A corresponding chemical vapor deposition method of forming the n-type semiconducting diamond is disclosed. The n-type semiconducting diamond of the invention may be usefully employed in the formation of diamond-based transistor devices comprising pn diamond junctions, and in other microelectronic device applications.

8 Claims, 2 Drawing Sheets

OTHER PUBLICATIONS

"Intrinsic Limitations of Doping Diamonds by Heavy-Ion Implantation," R. Kalish, et al. J. Appl. Phys, vol. 50, No. 11, Nov. 1979, pp. 6870–6872.

"Spatial Distribution of Impurities and Defects Introduced in Diamond by High Energy Ion Implatation," V. S. Varichenko et al., Phys. Stat. Sol., vol. 95, K123 (1986).

"Depth Profile of Antimony Implanted into Diamond," G. Brownstein, et al, J. Appl. Phys., vol. 50, No. 9, Sep. 19, 1979, pp. 5731–5735.

"Distribution of the Conductivity with the Depth in Diamond Doped by Bombardment with 10–45 KeV Li, Ions," V. S. Vavilov, et al, Soviet Physics–Semiconductors, vol. 4, No. 6, Dec., 1989, pp. 1000–1002.

"The Properities of Diamond,: edited by J. E. Field, Academic Press, London", 1979.

"Physical Properties of Diamond," R. M. Chrenko et al, General Electric Report 75 CRD089, Oct. 1975.

N-TYPE SEMICONDUCTING DIAMOND, AND METHOD OF MAKING THE SAME

BACKGROUND OF THE INVENTION

1. Field of The Invention

This invention relates to n-type semiconducting diamond, and to a method of making the same.

2. Description of The Related Art

Semiconducting (doped) diamond has a number of characteristics which render it theoretically attractive for high-frequency, high-power semiconductor device applications. Such properties include a low dielectric constant, high electrical field breakdown voltage, elevated temperature stability, high electron and hole mobilities (electrons and positively charged carriers being nearly equally mobile), high thermal conductivity, and good radiation hardness.

A variety of techniques for forming diamond have been developed (see "Emerging Technology of Diamond Thin Films," *Chemical and Engineering News*, May 15, 1989, pages 24–39), including high pressure, high temperature synthesis (catalytic and non-catalytic); shockwave synthesis; and chemical vapor deposition (including direct-current plasma chemical vapor deposition, microwave plasma chemical vapor deposition, and heated filament-assisted chemical vapor deposition).

Semiconducting natural or synthetic diamonds are most commonly found or prepared as p-type materials, with boron atoms being the most common impurity species. See, for example, "The Properties of Diamond," edited by J. E. Field, Academic Press, London, 1979; and "Physical Properties of Diamond," Chrenko, R. M. and Strong, H. M., General Electric Report 75CRD089, October, 1975. It is widely known that the introduction of gas phase boron-containing species, such as diborane, during the diamond growth process will produce p-type diamond in which the majority carriers are holes. See "Characterization of Conductive Diamond Film," Fujimori, N., Imai, T., and Doi, A., Proc. *ISIAT*, 1985; and "Characterization of Conducting Diamond Film," Fujimori, N., Imai, T., and Doi, A., *Vacuum*, Vol. 36, 99, 1986.

Until the discovery of the present invention, however, it has not been possible to produce n-type semiconducting diamond via low pressure techniques using impurities other than nitrogen. Nitrogen, however, is not an acceptable donor species. Nitrogen forms a deep donor in diamond, such that the energy level of nitrogen in the diamond bandgap is too far (approximately 1.4 eV) below the conduction band minimum to be useful for the fabrication of practical semiconductor devices. Accordingly, the deep character of the nitrogen impurity level relative to the diamond conduction band minimum renders it virtually impossible to develop any usable carrier concentrations of sufficient magnitude at useful operating temperatures in semiconductor device application.

Other n-type impurity species such as arsenic and lithium that yield n-type diamond have been incorporated in previously formed diamond crystal lattices by ion implantation techniques. See "Semiconducting Diamonds," Vavilov, V. S., and Konorova, E. A., *Sov. Phys. Usp.*, Vol. 19, 301, 1976; "Synthetic Diamonds In Electronics (review)", Bazhenov, V. K., Vikulian, I. M., and Gontar, A. G., *Sov. Phys. Semicond.*, Vol. 19, 829, 1985; "Bipolar Transistor Action In Ion Implanted Diamond," Prins, J. F., *Appl. Phys. Lett.*, Vol. 41, 950, 1982; "Electrical Properties of Ti and Cr Ion Implanted Diamonds Dependent on Target Temperature," Sato, S., Iwaki, M., and Sakairi, H., *Nuc. Inst. Meth. Phys. Res.*, B19/20, 822, 1987; "Semiconducting Diamond Technology," Yoder, M. N., *Naval. Res. Rev.*, Vol. 2, 27, 1987; and "Implantation of Antimony Ions into Diamond," V. S. Vavilov, M. A. Gukasyan, E. A. Konorova and Yu. V. Milyutin, *Soviet Physics-Semiconductors*, Vol. 6, p. 1998 (1973).

The incorporation of n-type impurity species into diamond crystal lattices by ion implantation, however, incurs the severe disadvantages of the implanted ions producing a heavily damaged surface layer which cannot be annealed away, and the implanted crystal needing to be post-implantion heat treated in order to electronically activate the implanted impurity.

Even with post-implantation heat treatment for electronic activation of the implanted impurity species, the highly damaged layer produced by ion implantation and the inhomogeneity and substantial concentration gradients of the ion implanted species across the implanted film thickness render the resulting n-type diamond wholly unsuitable for semiconductor device applications.

See "Distribution of the Conductivity With Depth in Diamond Doped by Bombardment With 10–45 Kev Li Ions, V. S. Vavilov, V. V. Galkin, V. V. Krasnopevtse and Yu. V. Milyutin, *Soviet Physics-Semiconductor*, 4, 1000, 1970; "Intrinsic Limitations of Doping Diamonds by Heavy-Ion Implantation," R. Kalish, M. Deicher, E. Recknagel and Th. Wichert, *J. Appl. Phys.*, 50, 6870, 1979; "Spatial Distribution of Impurities and Defects Introduced in Diamond by High Energy Ion Implantation," V. S. Varichenko, A. M. Zaitsev and V. F. Stelmakh, *Phys. Stat. Sol.*, 95, K123 (1986); and "Depth Profile of Antimony Implanted Into Diamond," G. Braunstein, J. Bernstein, V. Carsenty and R. Kalis, *J. Appl. Phys.*, 50, 5731, (1979).

Accordingly, it is an object of the present invention to provide, for the first time, an n-type semiconducting diamond which is usefully employed in n-type semiconductor device applications.

It is another object of the invention to provide an n-type semiconducting diamond material which is devoid of the gross morphological defects characteristic of prior art ion implantation techniques for incorporating n-type impurity species in diamond lattices.

It is another object of the present invention to provide a method of in-situ doping of diamond with n-type impurity atoms during the formation of the diamond.

Other objects and advantages will be more fully apparent from the ensuing disclosure and appended claims.

SUMMARY OF THE INVENTION

In a broad composition aspect, the present invention relates to an n-type semiconducting diamond doped with n-type dopant atoms.

Desirably, the dopant atoms are selected such that their activation energy is less than 0.6 eV, and preferably from about 0.03 eV to about 0.4 eV.

In contrast to the diamond crystals implanted with n-type impurities by ion implantation techniques, the n-type semiconducting diamond of the present invention is devoid of the heavily damaged regions which are inescapably present in n-type diamond produced by ion implantation techniques.

Further, in contrast to n-type semiconducting diamond formed by ion implantation techniques, which is typically characterized by a significant gradient of impurity species from the ion impingement surface of the diamond into the interior thereof, the n-type semiconducting diamond of the present invention is homogeneously doped with n-type dopant atoms.

The n-type semiconducting diamond of the present invention may be suitably formed by chemical vapor deposition of diamond which is doped in situ with n-type dopant atoms.

In a broad method aspect of the present invention, a diamond film is formed by chemical vapor deposition of diamond from a carbon source gas mixture, with the process being characterized by (1) the introduction into the carbon source gas mixture of a dopant quantity of a precursor source material for the n-type dopant species, e.g., an organometallic compound whose metal moiety is an n-type dopant species for the diamond film, and (2) the deposition of the n-type dopant species in situ along with the diamond to form the n-doped diamond film.

The n-type dopant species advantageously employed in the broad practice of the present invention may usefully include lithium, arsenic, scandium, antimony, bismuth, phosphorus, and the like, with lithium and arsenic being generally preferred.

The n-type dopant precursor compound yielding the n-type dopant atoms under chemical vapor deposition conditions may include organometallic compounds whose metal moiety is the n-type dopant species, and which decompose under the relevant chemical vapor deposition conditions to yield the impurity atoms, wherein the decomposition products of the dopant source compound do not preclude the n-type semiconducting character of the product diamond film from being achieved. For example, the organo moiety of the organometallic compound may comprise hydrogen and carbon, as well as any other suitable atoms, e.g., oxygen, so that (i) the carbon atoms deriving from the organo moiety of the organometallic compound are deposited to form the diamond film, and (ii) the hydrogen atoms in such organo moiety suppress formation of graphite and preferentially remove from the diamond film any graphite which is formed during the film growth process. Any suitable organo moiety may be employed, including alkyl, aryl, aralkyl, alkaryl, alkenyl, alkynyl, alkoxides, etc., provided that the corresponding source compound has suitable volatility characteristics to be usefully employed in the chemical vapor deposition process system and the resulting doped diamond is of n-type character. Lower alkyl organo moieties may be particularly usefully employed, and superior results have been achieved with secondary and tertiary butyl groups as the organo moiety of the organometallic source compound for the dopant metal species.

Other aspects and features of the invention will be more fully apparent from the ensuing disclosure and appended claims.

DETAILED DESCRIPTION OF THE INVENTION, AND PREFERRED EMBODIMENTS THEREOF

Figure 1:
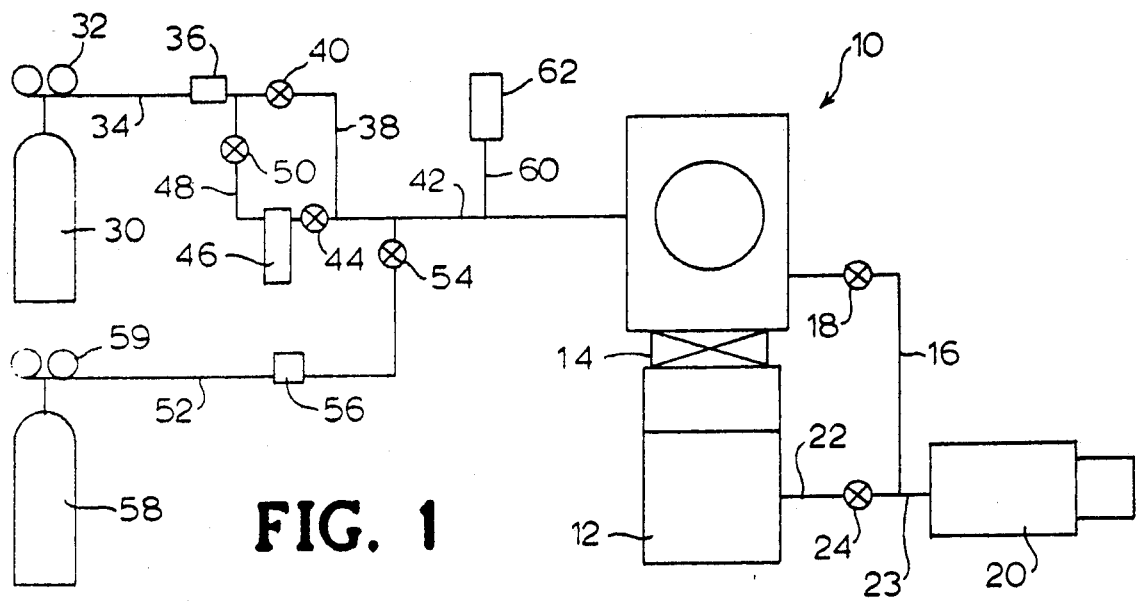
FIG. 1 is a schematic representation of a process system for preparing n-doped semiconducting diamond according to the present invention, in one embodiment thereof.

The present invention is based on the discovery that n-type semiconducting diamond may be readily formed by in situ doping of diamond during chemical vapor deposition formation of the diamond film, with introduction of a volatile precursor dopant source compound to the gas mixture being employed to form the diamond material in the chemical vapor deposition process.

By this approach, n-type impurity species may be incorporated into the growing diamond crystal in an electronically active state to yield a doped diamond product of n-type semiconducting character, i.e., wherein the majority carriers are electrons, and in which the diamond product does not require post-formation activation heat treatment to render the diamond crystal product electronically active.

By this in situ formation technique, shallow n-type impurity atoms may be incorporated in the diamond crystal lattice in a uniform manner, and without the occurrence of gross lattice asperities and other lattice damage artifacts which unavoidably result from ion implantation, the only method heretofore known for producing n-type semiconducting diamond. The deficiencies of such ion implantation techniques for forming semiconducting diamond have been discussed hereinabove, and such deficiencies are wholly overcome in the process and diamond composition of the present invention.

The n-type impurity species which may be advantageously incorporated in the diamond film during its chemical vapor deposition formation include any suitable impurity species producing the requisite n-type semiconducting material, i.e., which are compatible with the diamond crystal lattice, and which are shallow impurities having a sufficient energy level relative to the diamond conduction band to yield n-type semiconducting diamond product. Examples of such n-type impurity species include lithium, arsenic, phosphorus, scandium, antimony, bismuth, etc., with lithium and arsenic being preferred, and lithium most preferred.

Desirably, the n-type dopant species for the diamond is selected such that the activation energy of the dopant species is less than 0.6 electron volts. Preferably, the activation energy of the dopant species is between about 0.03 and about 0.4 eV, since at activation energy levels below about 0.03 eV, the dopant species become easily ionized at room temperature, and at activation energy levels above about 0.4 eV, the dopant species become increasingly harder to excite.

Set out in Table I below are estimated and measured ionization energies of various impurity atoms which can be incorporated in the diamond lattice.

TABLE I

Estimated and Measured Values of Impurity Atom Ionization Energies in Diamond

| Element | Estimated Value | Measured Value | Carrier Type |
|---|---|---|---|
| Li | 0.153 eV | 0.10 | electron |
| B | 0.306 | 0.30–0.37 | hole |
| P | 0.209 | — | electron |
| Sb | 0.181 | 0.15–0.32 | electron |
| As | 0.251 | — | electron |
| Al | 0.456 | 0.31 | hole |

TABLE I-continued

Estimated and Measured Values of Impurity
Atom Ionization Energies in Diamond

| Element | Estimated Value | Measured Value | Carrier Type |
|---------|-----------------|----------------|--------------|
| Ji      | 0.976           | 0.38–0.43      | hole         |
| Bi      | 0.321           | —              | electron     |

Table I shows the estimated and measured ionization energies of several impurity atoms in the diamond lattice. These estimated values are calculated from the known ionization energies of these impurity atoms in silicon which is also an elemental Group IV indirect band gap semiconductor similar to diamond. Based on the data set out in Table I, the most preferred impurity for n-type diamond is lithium.

The precursor source material for the doping deposition of the n-type impurity may be any suitable compound, alloy, mixture, or complex which is decomposable under the conditions employed for chemical vapor deposition of diamond, and which produces decomposition by-products which do not preclude the n-type semiconducting character of the doped diamond product from being developed.

Preferably, the source material for the n-type impurity is an organometallic compound whose metal moiety is the n-type impurity. The organo moiety may include, in addition to constituent carbon and hydrogen atoms, any other atoms or substituents, e.g., oxygen, which do not preclude the formation of n-type semiconducting diamond when present in the organometallic compound which is employed as a source material for the dopant species. For this reason, halo atoms generally are to be avoided, since such atoms are electron acceptors and produce p-type diamond material. Thus, chlorine, fluorine, bromine, iodine, as well as other acceptor species, are to be avoided in order to produce n-type semiconducting diamond of the desired character.

Preferably, the organo moiety consists only of carbon and hydrogen, and optionally oxygen, atoms. The advantage of such carbon/hydrogen composition is that the carbon atoms during the chemical vapor deposition procedure become incorporated in the growing diamond lattice, and thus constribute to the formation of the diamond, while the hydrogen serves to minimize the occurrence of graphite deposition in the diamond film, and to preferentially remove any graphite which is locally formed in the diamond lattice. Suitable organo groups include alkyl, aryl, aralkyl, alkaryl, alkenyl, akynyl, alkoxy, etc. The source compounds comprising such organo moieties desirably have volatility characteristics rendering them amenable to gas-phase transport to the chemical vapor deposition reactor, as a constituent of the gas mixture employed to form the diamond film, and "cleanly" decompose to yield the n-type impurity atom from the precursor material under the chemical vapor deposition conditions employed to form the semiconducting diamond.

The n-type semiconducting diamond of the invention may be formed via chemical vapor deposition, using techniques conventionally employed to form diamond per se by chemical vapor deposition from source gas mixtures. It is known that diamond films can be formed from a wide variety of materials via chemical vapor deposition techniques. Typically, the chemical vapor deposition formation of diamond is carried out from a source gas mixture containing simple hydrocarbons such as methane, ethane, ethylene, or acetylene, in combination with hydrogen (as a source of atomic hydrogen in the chemical vapor deposition process). Other carbon source compounds for the diamond film include volatile organics such as acetone, methanol, and the like. The same general considerations as discussed hereinabove in application to the source material for the n-type dopant species are applicable, in that the source gas mixture employed for forming the diamond material should be free of species whose atoms are acceptors or which otherwise preclude the n-type semiconducting diamond from being formed.

A highly preferred diamond source compound in the broad practice of the present invention is methane, which is suitably supplied in a chemical vapor deposition source gas mixture comprising methane and hydrogen. In such source gas mixture, the methane constituent is typically present in very low quantity relative to the hydrogen; illustrative compositions may include from about 0.05% to about 5% methane, with the balance hydrogen, and more preferably from about 0.1% to about 2% methane, with the balance hydrogen.

Generally, any of various conventional chemical vapor deposition techniques may be usefully employed for forming the n-type semiconducting diamond in the practice of the present invention. Examples include hot filament assisted chemical vapor deposition, electric-discharge plasma assisted chemical vapor deposition, radio frequency plasma assisted chemical vapor deposition, microwave plasma assisted chemical vapor deposition, direct-current arc discharge or "plasma jet" chemical vapor deposition, etc. Hot filament assisted chemical vapor deposition is generally preferred in the practice of the invention, utilizing a filament formed of tungsten or other appropriate high temperature material compatible with the chemical vapor deposition process conditions in which such filament is deployed.

The source compound for the n-type impurity may be introduced to the source gas mixture for chemical vapor deposition of diamond, in any suitable manner. For example, the n-type dopant source compound may suitably be a solid phase material at room temperature and the hydrogen carrier gas component of the source gas mixture may be passed in contact therewith. For such purpose, the solid dopant source compound should have a vapor pressure which is adequate to impart a sufficient concentration of the dopant source compound to the carrier gas, at the process conditions (temperature, pressure, and carrier gas flow rate) which exist at the locus of contacting the hydrogen carrier gas with the dopant source material. For this purpose, appropriate process sensors and control elements may be employed to maintain a selected set of process conditions in the dopant source material/carrier gas contacting operation.

Alternatively, the dopant source material may be volatilized and selectively metered into the chemical vapor deposition source gas mixture, or selected components thereof, via metering means such as a membrane selectively permeable to the dopant source compound. Any other suitable means of introducing the dopant source material or dopant species to the chemical vapor deposition source gas mixture may likewise be usefully employed.

In the chemical vapor deposition operation, the carbon and dopant species are deposited to yield a crystalline diamond film doped with the n-type impurity atoms. The rate of growth of the diamond film may be selectively varied as desired or necessary in a given application, but it generally is satisfactory to deposit the diamond film at a rate of growth on the order of from about 0.05 to about 40 micrometers per hour, with preferred growth rates generally being on the order of from 0.2 to about 5 micrometers per hour.

In the chemical vapor deposition chamber, the n-type doped diamond film is laid down on a suitable substrate. The substrate material is not critical as regards the character of the present invention, and any of a wide variety of substrate materials may be employed, as for example metals, such as copper, titanium, molybdenum, tantalum, and tungsten; ceramics and high temperature-resistant, relatively hard materials, such as tungsten carbide, boron nitride, titanium carbide, silicon carbide, silicon nitride, titanium nitride, boron phosphide, silicon aluminum oxynitride, alumina, and aluminosilicates; crystalline materials, such as natural or synthetic diamond, sapphire, silicon, and silica; graphite; etc.

As indicated, the chemical vapor deposition source gas mixture may include any of a wide variety of suitable carbon source compounds for the diamond film. Illustrative examples include hydrocarbons, alcohols, ethers, carbon monoxide, ketones, etc.

The doping concentration of the n-type impurities in the diamond film of the invention may be varied widely depending on the specific semiconducting character of the n-type semiconducting diamond which is desired. In general, it is sufficient to incorporate n-type impurity atoms in the diamond film at a concentration of from about $10^{16}$ impurity atoms per cubic centimeter to about $10^{18}$ impurity atoms per cubic centimeter. Correspondingly, the resistivity of the resulting n-type semiconducting diamond may be varied widely, but typically is in the range of from about $10^{-3}$ to about $10^3$ ohm centimeters.

The methodology of the invention may be used in combination with the in situ doping of p-type impurities, as by in situ boron doping of a diamond film, in regions thereof distinct from the n-doped regions. In such manner, the invention can be advantageously employed to produce pn semiconductor junctions for the fabrication of diamond transistor structures, by chemical vapor deposition technology, for the first time. Accordingly, the invention achieves a substantial advance in the art, enabling the fabrication of commercially practical diamond transistor structures.

Referring now to the drawings, FIG. 1 shows a schematic representation of a chemical vapor deposition process system in which the process of the present invention may be carried out to produce n-type semiconducting diamond. As illustrated, the system comprises a chemical vapor deposition growth chamber 10 communicating with a diffusion pump 12 by means of plenum connection 14. The growth chamber 10 is joined by means of conduit 16, having valve 18 disposed therein, and conduit 23, to a roughing pump 20. Conduit 16 and 23 are also joined to diffusion pump 12 by means of conduit 22 having valve 24 disposed therein.

The system comprises a source means 30 for carrier gas, which has associated therewith a regulator assembly 32, and conduit 34 joining the regulator assembly with a mass flow controller 36. The mass flow controller 36 is joined by by-pass conduit 38, having control valve 40 therein, to a source gas mixture feed conduit 42 having valve 44 disposed therein, and joining the chemical vapor deposition growth chamber 10 to the dopant bubbler 46. The dopant bubbler in turn is joined to conduit 38 by means of carrier gas feed conduit 48 having valve 50 disposed therein.

Joined to the source gas mixture feed conduit 42, by means of carbon source gas feed conduit 52 having valve 54 and mass flow controller 56 disposed therein, is a regulator assembly 59 associated with a carbon source gas supply means 58. The source gas mixture feed conduit 42 is also joined by means of branch conduit 60 to a mass spectrometer 62.

Figure 2:
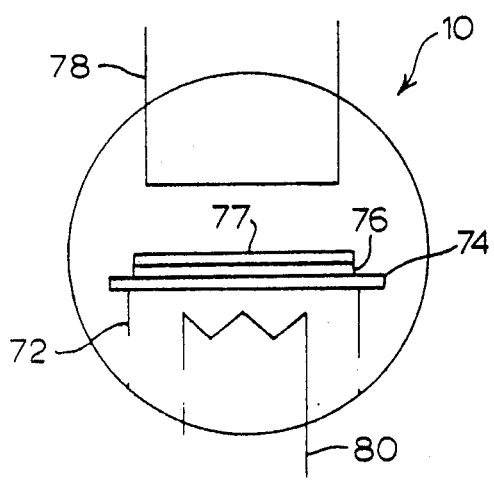
FIG. 2 is a simplified schematic representation of a portion of the growth chamber of the FIG. 1 system.

FIG. 2 shows a simplified schematic representation of the layout of the chemical vapor deposition growth chamber 10 of FIG. 1. The chemical vapor deposition growth chamber 10 contains a deposition platform 72, on the top face of which is mounted a substrate support element 74 for supportively reposing thereon a substrate 76. Overlying the substrate and in close proximity thereto is a heating filament 78. The heating filament 78 and substrate heating element 80 are suitably joined to appropriate energizing means (not shown) for actuating these heating structures to effect heating.

To prepare the system for operation, the chemical vapor deposition growth chamber 10 is evacuated to a suitable low pressure, to substantially remove all hold-up gas contained therein. The growth chamber is initially rough-pumped to a pressure which may for example be on the order of about $10^{-3}$ millimeters Hg, by actuating the roughing pump 20, with valve 18 in conduit 16 and valve 24 in conduit 22 being open, so that the growth chamber 10, plenum connection 14, and diffusion pump 12 are all evacuated to the desired low pressure level. Subsequent to achievement of the desired rough-pumped pressure level, valve 18 in conduit 16 and valve 24 in conduit 22 are closed. The diffusion pump 12 then is activated to further reduce the vacuum pressure level in growth chamber 10 to a level on the order of 2-10 microns Hg. Once the growth chamber has been thus evacuated, it is ready to receive the source gas mixture, when the chamber has been brought to proper elevated temperature.

In operation, a substrate 76 is placed on the substrate support element 74 of the deposition platform 72, and the substrate heating element 80 is activated to heat the substrate 76 to a suitable temperature, e.g., on the order of from about 400° C. to about 1050° C.

Concurrently, the heating filament 78 is energized to bring same to a suitable temperature for carrying out chemical vapor deposition, e.g., a temperature on the order of from about 1800° C. to about 2500° C.

The regulator assembly 32 then is opened to flow hydrogen gas from carrier gas source means 30 through the regulator assembly and conduits 34 and 48 to the dopant bubbler 46, with valve 50 in line 48 being open, and valve 40 in bypass conduit 38 being closed. The mass flow rate of the hydrogen carrier gas is monitored and selectively adjusted by means of the mass flow controller 36 in carrier gas feed conduit 34. In the bubbler 46, the hydrogen carrier gas is contacted with an n-type dopant source compound, such as solid t-butyllithium at ambient temperature, so that t-butyllithium in the vapor phase of such solid is added to the carrier gas in the desired concentration. The resulting dopant source compound-containing hydrogen carrier gas flows into the source gas mixture feed conduit 42, with valve 44 being open.

Simultaneously, the regulator assembly 59 of carbon source gas supply means 58 is opened to flow methane, as the carbon source compound for diamond film formation, through conduit 52 to the source gas mixture feed conduit 42, valve 54 in conduit 52 being open. Mass flow controller 56 in conduit 52 monitors the mass flow rate of the methane gas and maintains a predetermined mass flow rate of methane.

Thus, the hydrogen carrier gas containing dopant source compound, and the carbon source compound, are mixed with one another in conduit 42 to form the chemical vapor deposition source gas mixture. The respective carrier gas mass flow controller 36 and the carbon source gas mass flow controller 56 are suitably operated to provide a desired source gas mixture composition in conduit 42, e.g., 99.5% hydrogen, 0.5% methane, and 10 parts per million t-butyllithium, on a total gas mixture volume basis.

This source gas mixture may be selectively sampled by withdrawal from feed conduit 42 in branch conduit 60 for analysis in mass spectrometer 62, to ensure that the source gas mixture entering the chemical vapor deposition growth chamber 10 is of the desired composition.

The source gas mixture for the n-doped diamond film then is flowed into the chemical vapor deposition growth chamber 10 at a flow rate which may for example be on the order of from about 20 to about 250 cubic centimeters per minute, at a total gas pressure which may be on the order of from about $10^{-4}$ to about 300 Torr.

The hot filament 78 may be spaced from the substrate 76 in the growth chamber at a distance on the order of from about 0.5 to about 2 centimeters.

The source gas mixture entering the growth chamber 10 is heated by the filament 78 to effect decomposition of the methane (carbon source gas) to form atomic carbon and atomic hydrogen therefrom, the carbon depositing on the substrate 76 to form diamond and the atomic hydrogen deriving from the methane, as well as from the hydrogen carrier gas, serving to selectively remove any graphite which may be formed in the growing diamond film.

Concurrently, the t-butyllithium is decomposed so that atomic lithium is deposited as the n-type impurity in the diamond film 77, as the n-type dopant therefor. The alkyl moiety of the lithium source compound is further decomposed to atomic carbon and hydrogen constituents, the carbon thus being available as a constituent for the diamond film 77 and the hydrogen of the alkyl moiety being converted to atomic hydrogen which as indicated serves to suppress the formation of graphite and to remove any graphite which is formed on the surface of the growing diamond film.

There is resultingly produced an n-doped diamond of semiconducting character and high quality which may be usefully employed in the fabrication of semiconductor devices, including the use of the n-type semiconducting diamond in pn junctions for the fabrication of diamond-based transistor structures, as previously described.

It will be recognized that the process conditions and compositional characteristics referred to in the preceding description are of illustrative character only, and that such process and compositional parameters may be varied widely in the broad practice of the present invention.

Figure 3:
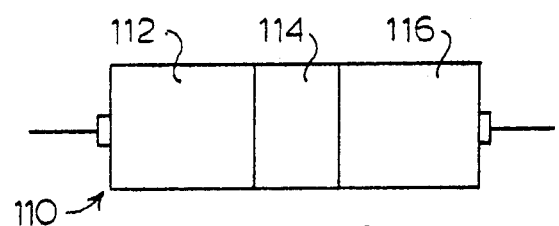
FIG. 3 is a schematic representation of a diamond transistor in accordance with the present invention.

FIG. 3 shows a schematic representation of a diamond transistor 110 according to the present invention, of conventional p-n-p arrangement, with p-type portions 112 and 116, and an intervening n-type portion 114 of semiconducting diamond in accordance with the present invention therebetween.

The features and advantages of the present invention are more fully illustrated with respect to the following non-limiting examples, wherein all parts and percentages are by weight, unless otherwise expressly stated.

EXAMPLE I

Using a chemical vapor deposition system of the type described above in connection with FIGS. 1 and 2 hereof, a diamond film was grown by hot filament assisted chemical vapor deposition under the following process conditions: total gas pressure of the source gas mixture introduced into the growth chamber = 10 Torr; total gas flow rate of the source gas mixture = 100 cm$^3$/min.; substrate temperature = 850° C.; filament temperature = 2,000° C.; filament-to-substrate spacing distance = 1 cm; and source gas composition = 0.5% methane and 99.5% hydrogen (by volume). The substrate was silicon.

The resulting diamond film had a film resistance of greater than $10^7$ ohm as measured between electrodes of 1 cm spacing therebetween.

EXAMPLE II

The procedure of Example I was repeated except that the source gas composition was changed to the following: 0.5% methane, 0.1% argon containing 54 parts per million diborane, and 99.4% hydrogen (by volume).

The resulting diamond film exhibited p-type behavior, as evidenced by measurement of the sign of the Seebeck effect at near room temperature conditions. The film resistance of this p-type diamond film was $30 \times 10^3$ ohms.

EXAMPLE III

The procedure of Example I was again repeated except that the hydrogen gas was passed through a bubbler containing t-butyllithium solid at room temperature.

The resulting diamond film exhibited n-type behavior as evidenced by measurement of the sign of the Seeback effect at near room temperature conditions. The film resistance of this n-type semiconducting diamond was 45 ohms.

While the invention has been described herein with reference to specific aspects, features and embodiments, it will be apparent that other variations, modifications, and embodiments are possible, and all such variations, modifications, and embodiments therefore are to be regarded as being within the spirit and scope of the invention.

What is claimed is:

1. N-type semiconducting diamond, homogeneously doped with scandium dopant atoms.

2. N-type semiconducting diamond, according to claim 1, wherein the scandium dopant atoms are incorporated in the diamond at a concentration of from about $10^{16}$ scandium dopant atoms per cubic centimeter to about $10^{18}$ scandium dopant atoms per cubic centimeter.

3. N-type semiconducting diamond formed by chemical vapor deposition and doped in-situ during chemical vapor deposition formation with scandium atoms.

4. N-type semiconducting diamond, comprising scandium dopant atoms.

5. N-type semiconducting diamond doped with scandium atoms, formed by chemical vapor deposition from a chemical vapor deposition source gas mixture comprising a carbon source precursor compound and an n-type impurity precursor compound for scandium.

6. N-type semiconducting diamond doped with scandium atoms, having a crystal lattice characterized by the absence of gross lattice asperities and other lattice damage artifacts characteristic of ion implantation techniques.

7. A diamond-based transistor, comprising a pn junction including n-type semiconducting diamond intrinsically doped with scandium atoms.

8. N-type semiconducting diamond having a resistivity of from about $10^{-3}$ to about $10^3$ ohm centimeters, and intrinsically doped with scandium atoms at a concentration of from about $10^{16}$ scandium atoms per cubic centimeter to about $10^{18}$ scandium atoms per cubic centimeter.

* * * * *